(12) United States Patent
Lai

(10) Patent No.: US 7,582,937 B2
(45) Date of Patent: Sep. 1, 2009

(54) ESD PROTECTION CIRCUIT

(75) Inventor: Chun-Hsiang Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 201 days.

(21) Appl. No.: 11/639,143

(22) Filed: Dec. 15, 2006

(65) Prior Publication Data

US 2008/0144242 A1    Jun. 19, 2008

(51) Int. Cl.
*H01L 23/62* (2006.01)
(52) U.S. Cl. .............. 257/355; 257/107; 257/173; 257/E29.225; 257/E29.337; 361/56
(58) Field of Classification Search .............. 257/107, 257/173, 355, E29.225, E29.337; 361/56
See application file for complete search history.

(56) References Cited

U.S. PATENT DOCUMENTS 5,872,379 A * 2/1999 Lee ............................. 257/355
6,538,266 B2 * 3/2003 Lee et al. ..................... 257/173
6,674,622 B1 * 1/2004 Yu et al. ......................... 361/56
6,965,504 B2 * 11/2005 Liu et al. ........................ 361/58
2002/0145164 A1 * 10/2002 Kunz et al. ................... 257/360
2005/0269641 A1 * 12/2005 Lai et al. ...................... 257/355
2007/0096213 A1 * 5/2007 Tsai et al. ..................... 257/355

* cited by examiner

*Primary Examiner*—Andy Huynh
(74) *Attorney, Agent, or Firm*—Rabin & Berdo, P.C.

(57) ABSTRACT

An ESD protection circuit includes a substrate, diode device, first snapback device, ring structure, second snapback device and a control circuit. The diode device is formed in the substrate. The first snapback device is formed in the substrate and includes a first heavy ion-doped region, a first gate and a second heavy ion-doped region. The first heavy ion-doped region is coupled to the diode device. The first gate is coupled to the second heavy ion-doped region. The ring structure is formed in the substrate and includes a third heavy ion-doped region located. The second gate is formed on the substrate between the second heavy ion-doped region and the third heavy ion-doped region to generate a second snapback device. The control circuit is connected to the third heavy ion-doped region for preventing the turn-on of a parasitic SCR formed in the substrate in a normal operation.

27 Claims, 5 Drawing Sheets

ESD PROTECTION CIRCUIT

BACKGROUND OF THE INVENTION

1. Field of the Invention

The invention relates in general to an ESD protection circuit, and more particularly to an ESD protection circuit including a diode device and snapback device to form a parasitic SCR.

2. Description of the Related Art

FIG. 1 is a schematic diagram of a semiconductor structure of a conventional ESD protection circuit for a high-voltage input pad of a display. As shown in FIG. 1, the semiconductor structure of an ESD protection circuit includes a P-substrate 100, a diode string 110, a P-ring 120, a p-ring control circuit 130 and an N-type metal oxide semiconductor (NMOS) transistor 140. The diode string 110 is connected to an input pad 150, the NMOS transistor 140 is connected to the diode string 110, and a parasitic silicon-controlled rectifier (SCR) is formed in the P-substrate 100 between the first diode 160 and the NMOS transistor 140. There can be one, two or more diodes in a diode string. The number of the diodes in the diode string 110 can adjust the turn-on voltage of the ESD protection.

In a normal operation, the p-ring control circuit 130 controls the P-ring 120 to avoid the turn-on of the parasitic SCR, while during an ESD event, the parasitic SCR is turned on to release ESD current to achieve the effect of ESD protection. However, how to reduce an area of the ESD protection circuit to meet the requirement of small size is an essential subject in IC development.

SUMMARY OF THE INVENTION

It is therefore an object of the invention to provide an ESD protection circuit. In the ESD protection circuit, a ring structure is controlled by a control circuit to avoid the turn-on of the parasitic SCR formed between a diode device and a first snapback device, and a second snapback device is formed between the ring structure and the first snapback device, which can serve as a power clamp during the normal operation. Therefore, the area of the ESD protection circuit can be reduced since it embeds the power clamp such that no extra area is needed for it.

The invention achieves the above-identified object by providing an ESD protection circuit connected to an input pad. The ESD protection circuit includes a substrate, diode device, first snapback device, ring structure, second snapback and a control circuit. The diode device, which is the first one in the diode string, is formed in the substrate and has a first end and a second end. The first end is connected to the input pad. There can be one, two or more diodes in a diode string. The number of the diodes in the diode string can adjust the turn-on voltage of the ESD protection. The first snapback device is formed in the substrate and includes a first heavy ion-doped region, a first gate and a second heavy ion-doped region. The first heavy ion-doped region is coupled to the second end, the first gate is coupled to the second heavy ion-doped region, and a parasitic SCR is formed in the substrate between the first end and the second heavy ion-doped region. If the second heavy ion-doped region is connected to GND, this SCR will provide a pad-to-GND path to bypass ESD current.

Besides, the ring structure is formed in the substrate and includes a third heavy ion-doped region located between the diode device and the second heavy ion-doped region. The second gate is formed on the substrate between the second heavy ion-doped region and the third heavy ion-doped region. The second gate, the second heavy ion-doped region and the third heavy ion-doped region form a second snapback device, and the second gate is coupled to the second heavy ion-doped region. The control circuit is connected to the third heavy ion-doped region for preventing the turn-on of the parasitic SCR in a normal operation. Besides, another SCR is formed in the substrate between the first end and the third heavy ion-doped region. If the control circuit is VDD (the power source), the SCR will provide a pad-to-VDD path to bypass ESD current, and the snapback device will become a power clamp.

The invention achieves the above-identified object by providing an ESD protection circuit connected to an input pad. The ESD protection circuit includes a substrate, diode device, first snapback device, ring structure, second snapback device and control circuit. The diode device, which is the first one in the diode string, is formed in the substrate and has a first end and a second end, wherein the first end is connected to the input pad. There can be one, two or more diodes in a diode string. The number of the diodes in the diode string can adjust the turn-on voltage of the ESD protection. The first snapback device is formed in the substrate and has a first heavy ion-doped region, a first gate and a second heavy ion-doped region. The first heavy ion-doped region is coupled to the second end, the first gate is coupled to the second heavy ion-doped region, and a parasitic SCR is formed in the substrate between the first end and the second heavy ion-doped region. If the second heavy ion-doped region is connected to GND, this SCR will provide a pad-to-GND path to bypass ESD current.

Besides, the ring structure is formed in the substrate and includes a third heavy ion-doped region located between the diode device and the second heavy ion-doped region. The second gate is formed on the substrate between the second heavy ion-doped region and the third heavy ion-doped region. The second gate, the second heavy ion-doped region and the third heavy ion-doped region form a second snapback device, and the second gate is coupled to the second heavy ion-doped region. The control circuit is connected to the third heavy ion-doped region for providing an operational voltage to the ring structure to avoid the turn-on of the parasitic SCR in a normal operation. Besides, another SCR is formed in the substrate between the first end and the third heavy ion-doped region. If the control circuit is VDD (the power source), the SCR will provide a pad-to-VDD path to bypass ESD current, and the snapback device will become a power clamp.

Other objects, features, and advantages of the invention will become apparent from the following detailed description of the preferred but non-limiting embodiments. The following description is made with reference to the accompanying drawings.

DETAILED DESCRIPTION OF THE INVENTION

Embodiment One

Figure 1:
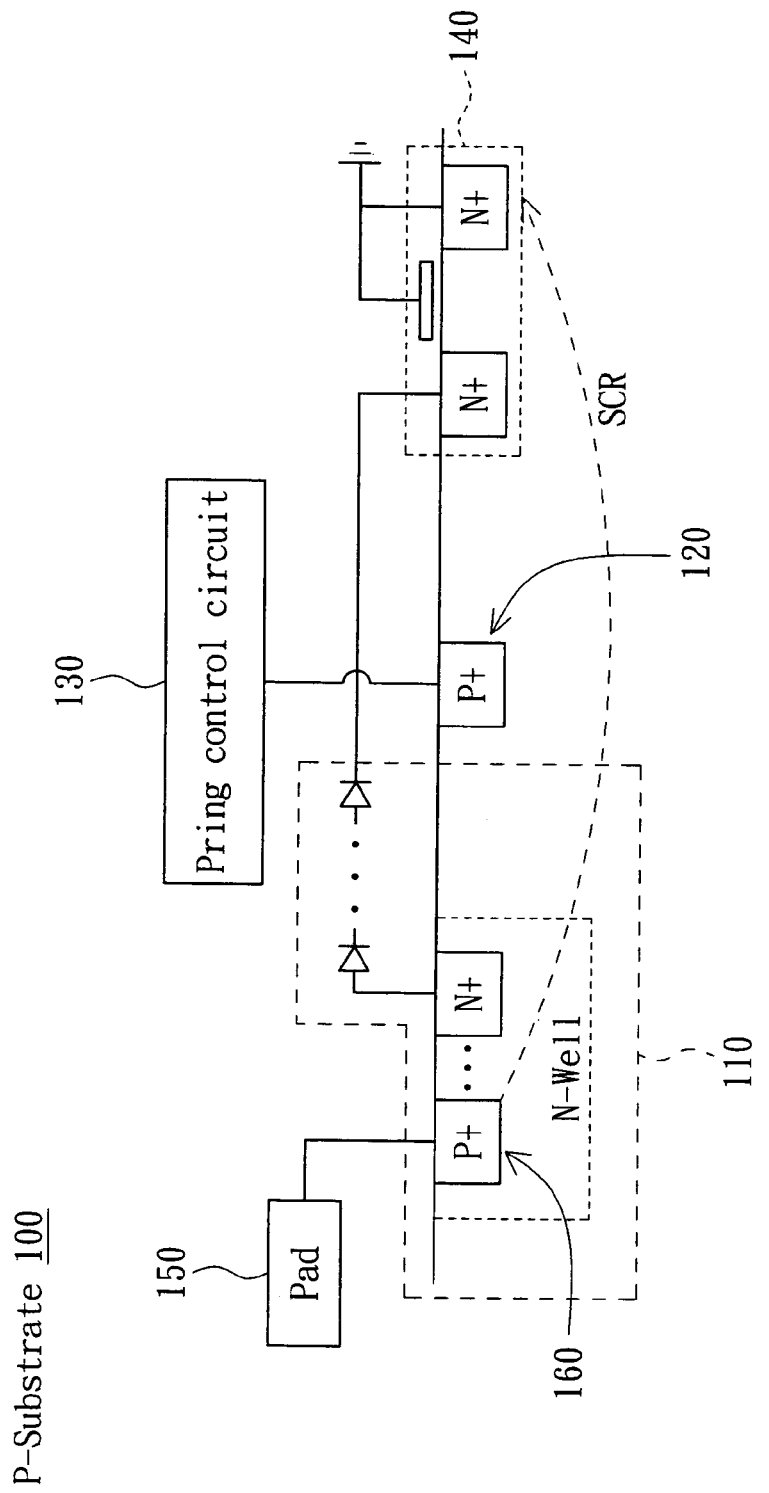
FIG. 1 is a schematic diagram of a semiconductor structure of a conventional ESD protection circuit for a high-voltage input pad of a display.
Figure 2:
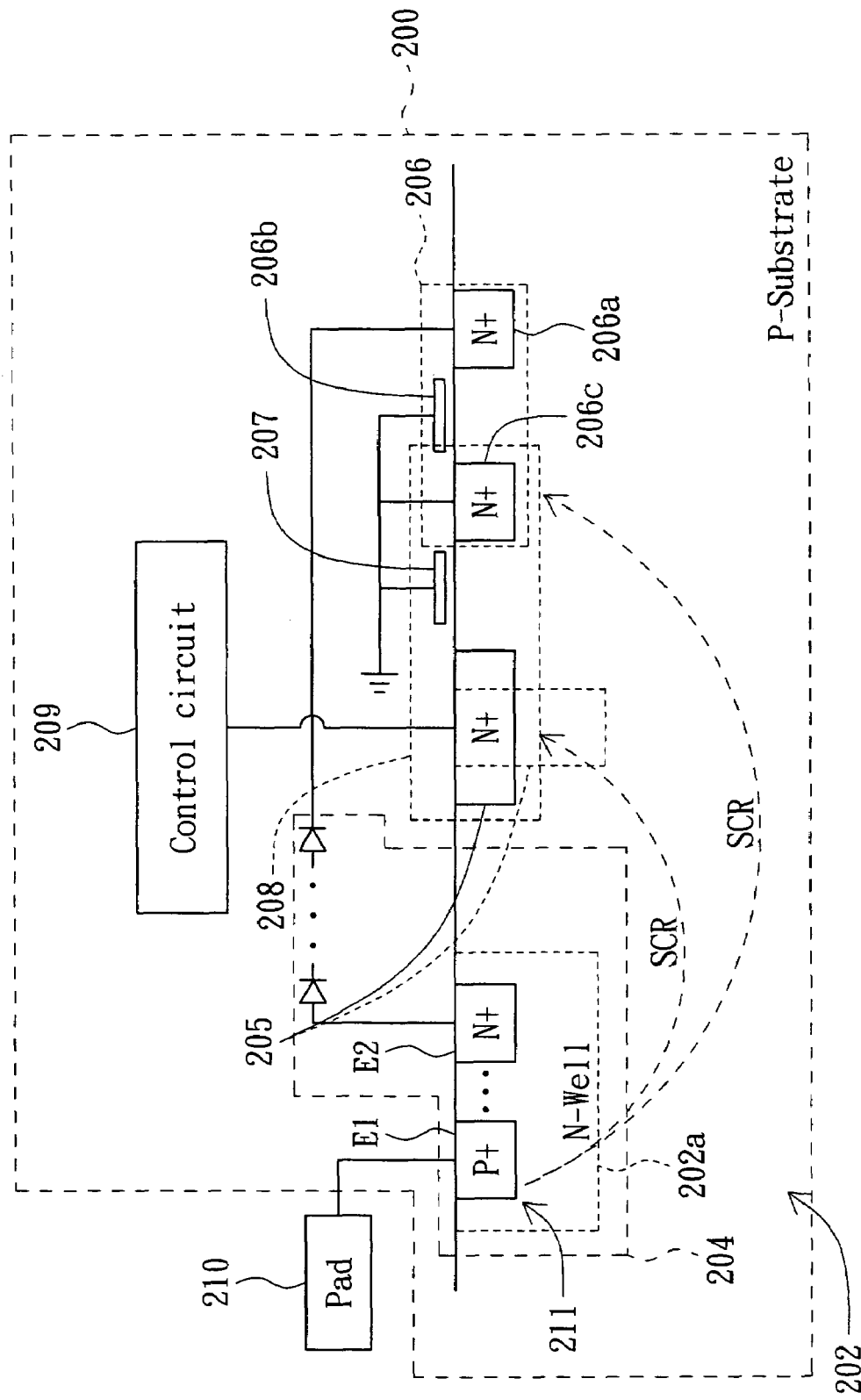
FIG. 2 is a schematic diagram of a semiconductor structure of an ESD protection circuit according to a first embodiment of the invention.

Referring to FIG. 2, a schematic diagram of a semiconductor structure of an ESD protection circuit according to a first embodiment of the invention is shown. An ESD protection circuit 200 is connected to an input pad 210, such as a high-voltage input pad, and includes a substrate 202, a diode string 204, a first snapback device 206, a ring structure 205, a second snapback device 208, and a control circuit 209. The diode device 211 is formed in the substrate 202 and includes a first end E1 and a second end E2, wherein the first end E1 is connected to the input pad 210. In the embodiment, the substrate 202 is a P-substrate, the diode device 211 is the first diode of the diode string 204, the first end E1 is a P+ region and the second end E2 is an N+ region. The diode device 211 is formed in a first N-well 202a of the substrate 202. There can be one, two or more diodes in the diode string 204. The number of the diodes in the diode string 204 can adjust the turn-on voltage of the ESD protection 200.

The first snapback device 206 is formed in the substrate 202 and includes a first heavy ion-doped region 206a, a first gate 206b, and a second heavy ion-doped region 206c, wherein the first heavy ion-doped region 206a is coupled to the second end E2, and the first gate 206b is coupled to the second heavy ion-doped region 206c. In the embodiment, the first snapback device 206 is a NMOS transistor, the first and the second heavy ion-doped regions 206a and 206c are both N+ regions and the second heavy ion-doped region 206c is grounded. Therefore, it can be seen from FIG. 2 that the first end (P+ region) E1, the first N-well 202a, the (P-typed) substrate 202 and the second heavy ion-doped (N+) region 206c form a parasitic pad-to-GND SCR.

The ring structure 205 is formed in the substrate 202 and includes a third heavy ion-doped region 205a located between the second end E2 of the diode device 211 and the second heavy ion-doped region 206c. The second gate 207 is formed on the substrate 202 between the second heavy ion-doped region 206c and the third heavy ion-doped region 205a, wherein the second gate 207, the second heavy ion-doped region 206c and the third heavy ion-doped region 205a form a second snapback device 208, and the second gate 207 is coupled to the second heavy ion-doped region 206c.

In the embodiment, the ring structure 205 is an N-ring, the third heavy ion-doped region 205a is an N+ region and the second snapback device 208 is a NMOS transistor. The ring structure 205 includes a second N-well 205b formed between the first N-well 202a and the second heavy ion-doped region 206c. The third heavy ion-doped region 205a is formed upon the second N-well 205b with the second N-well 205b deeper than the third heavy ion-doped region 205a. Besides, in order to form the second snapback device 208, it is designed that two sides of the second N-well 205b are located within two sides of the third heavy ion-doped region 205a. Especially, the ring structure 205 utilizing the N-ring can improve the latch-up immunity of the ESD protection circuit 200 during the normal operation.

It can be seen from FIG. 2 that the first end (P+ region) E1, the first N-well 202a, the (P-typed) substrate 202 and the third heavy ion-doped (N+) region 205a form another parasitic SCR. The two parasitic SCRs mentioned above provide two discharge paths for ESD current during an ESD event, which improves ESD robustness of the ESD protection circuit 200.

Figure 3A:
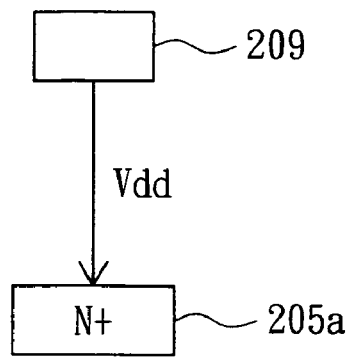
FIG. 3A and FIG. 3B are two examples of the control circuit of the ring structure in FIG. 2.
Figure 3A:
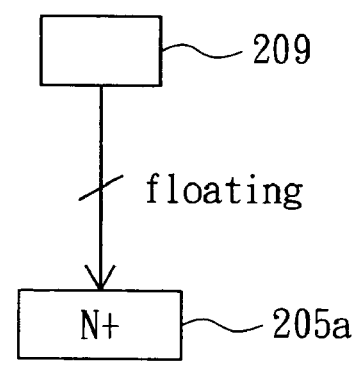

The control circuit 209 is connected to the third heavy ion-doped region 205a to avoid accidental turn-on of the parasitic SCRs in a normal operation. In one example, as shown in FIG. 3A, the control circuit 209 provides an operational voltage, such as a high voltage Vdd, to the third heavy ion-doped region 205a of the ring structure 205 in the normal operation to avoid the turn-on of the parasitic SCRs, while the third heavy ion-doped region 205a is floating during an ESD current. It can be seen from FIG. 3A that the second snapback device 208 forms a power clamp between the high voltage Vdd and a ground voltage. Because the power clamp is always needed for an ESD protection circuit, the area of the ESD protection circuit 200 can be reduced.

Figure 3B:
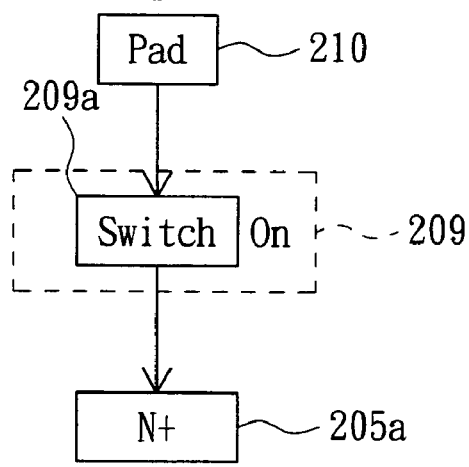
Figure 3B:
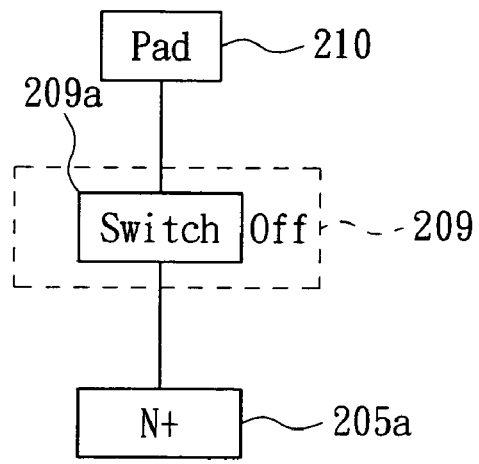

In another example, as shown in FIG. 3B, the control circuit 209 includes a switch 209a coupled to the input pad 210. The switch 209a is turned on to conduct a pad signal from the input pad 210 to the ring structure 205 to avoid the turn-on of the parasitic SCR in a normal operation, while the switch is turned off during an ESD event.

Figure 4A:
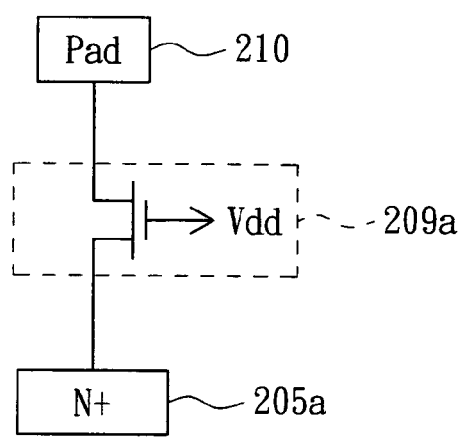
FIG. 4A to FIG. 4D are four examples of the switch used in the control circuit of FIG. 3B.

FIG. 4A to FIG. 4D show some alternatives for a structure of the switch 209a of FIG. 3B. As shown in FIG. 4A, the switch 209a includes an NMOS transistor N1 with the drain connected to the input pad 210 and the source connected to the third heavy ion-doped region 205a. The operational voltage Vdd is provided to the gate of the NMOS transistor N1 to turn on NMOS transistor N1 in a normal operation while the voltage Vdd is floating during an ESD event to turn off the NMOS transistor N1.

Figure 4B:
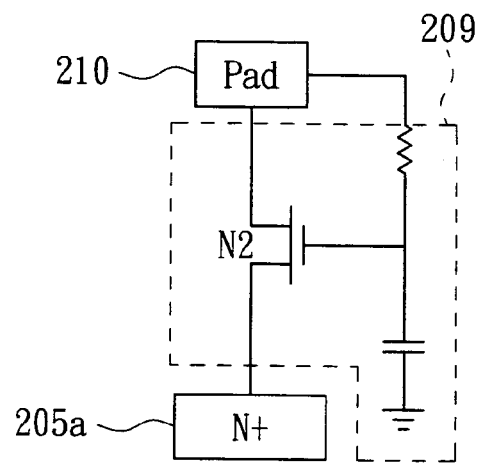
Figure 4C:
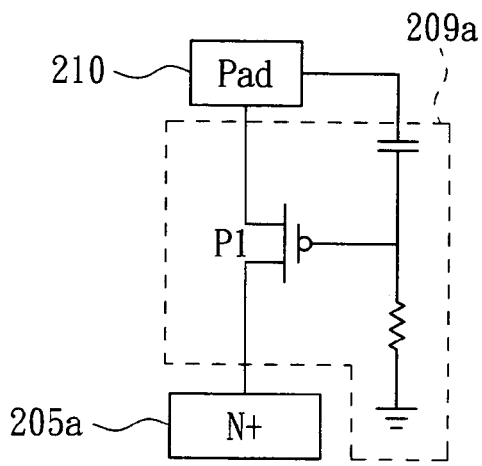

As shown in FIG. 4B or in FIG. 4C, the switch 209a includes a RC-coupled NMOS transistor N2 or a RC-coupled PMOS transistor P1 with the drain connected to the input pad 210 and the source connected to the third heavy ion-doped region 205a. By using a suitable RC time constant, the NMOS transistor N2 or the PMOS transistor P1 can be turned on in the normal operation and turned off during the ESD event.

Figure 4D:
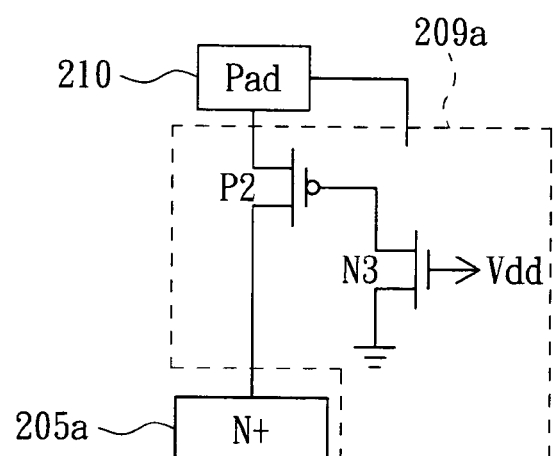

Or as shown in FIG. 4D, the switch 209a includes a PMOS transistor P2 and a NMOS transistor N3. The PMOS transistor P2 has a drain connected to the input pad 210 and a source connected to the third heavy ion-doped region 205a. The NMOS transistor N3 has a drain connected to a gate of the PMOS transistor P2, and a source grounded. Similarly, during the normal operation, the voltage Vdd is provided to the gate of the NMOS transistor N3 to turn on the NMOS transistor N3 and successively turn on the PMOS transistor P2 by grounding its gate. During the ESD event, the voltage Vdd is floating and the NMOS transistor N3 is turned off to make the gate of the PMOS transistor P2 floating. Finally, the PMOS transistor P2 is turned off due to its gate coupled to a high voltage from the input pad 210.

Embodiment Two

Figure 5:
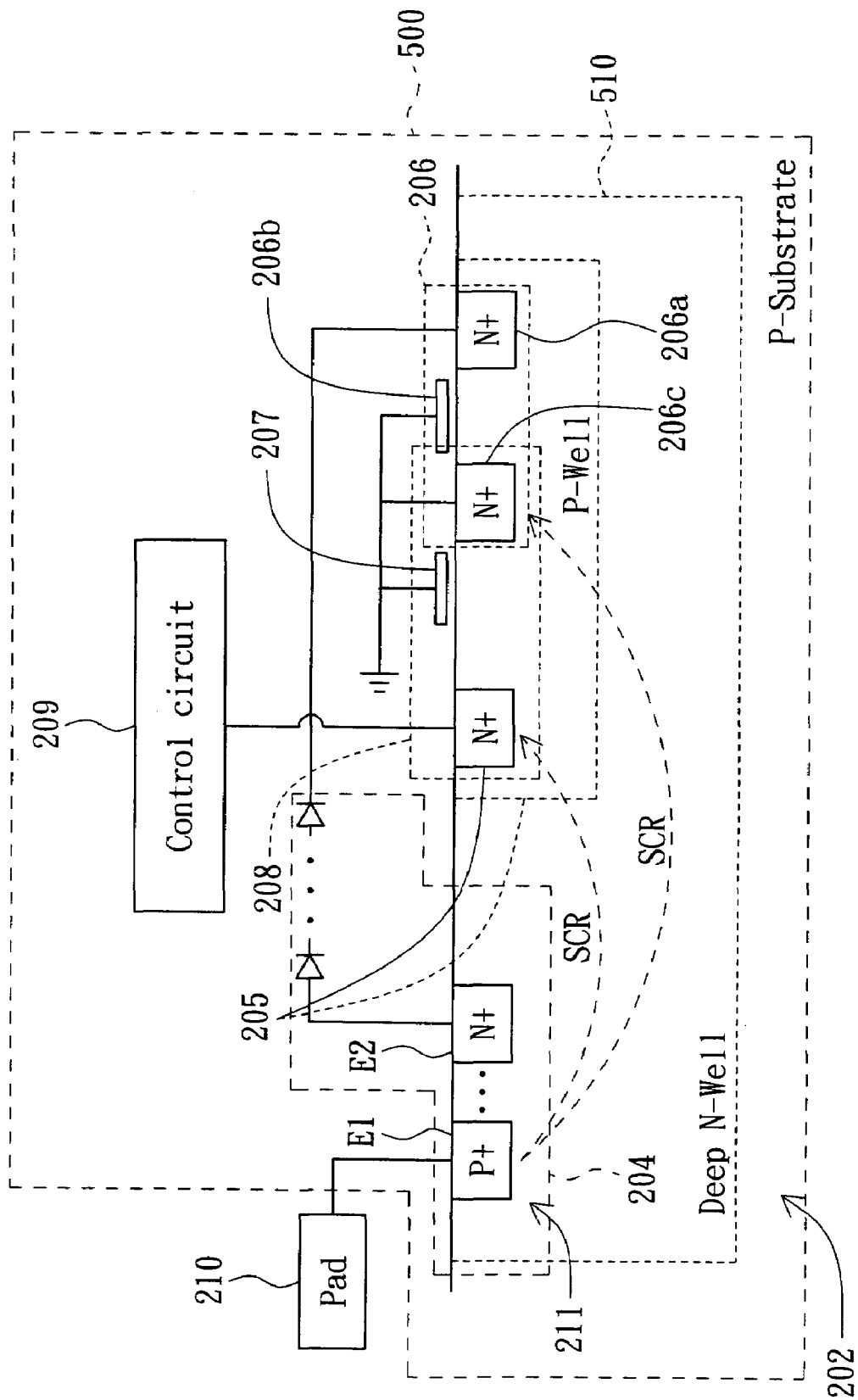
FIG. 5 is a schematic diagram of a semiconductor structure of an ESD protection circuit according to a second embodiment of the invention.

Referring to FIG. 5, a schematic diagram of a semiconductor structure of an ESD protection circuit according to a second embodiment of the invention is shown. Different from the ESD protection circuit 200, the substrate 202 of the ESD includes a deep N-well 510, and the ring structure 205, such as an N-ring, includes a P-well 520 formed in the deep N-well 510 and the third heavy ion-doped region 205a formed in the P-well 520. The ring structure 205 utilizing the N-ring can improve the latch-up immunity of the ESD protection circuit 500 during the normal operation. Furthermore, the diode device 211 is formed in a region of the deep N-well 510 outside the P-well 520, and the first snapback device 206 and the second snapback device 208 are formed in the P-well 520. Since the other structure of the ESD protection circuit 500 is the same as that of the ESD protection circuit 200, any detail is not necessary to be given here.

In the embodiment, the first snapback device 206 is a NMOS transistor, and the first and the second heavy ion-doped regions 206*a* and 206*c* are both N+ regions. Therefore, it can be seen from FIG. 5 that the first end (P+ region) E1, the deep N-well 510, the P-well 520 and the second heavy ion-doped (N+) region 206*c* form a parasitic SCR. Similarly, the first end (P+ region) E1, the deep N-well 510, the P-well 520 and the third heavy ion-doped (N+) region 205*a* form another parasitic SCR. The two parasitic SCRs can provide two discharge paths for ESD current during an ESD event, which improves ESD robustness of the ESD protection circuit 500.

Similar to the ESD protection circuit 200, as shown in FIG. 3A, the control circuit 209 can provide an operational voltage, such as a high voltage Vdd, to the third heavy ion-doped region 205*a* in the normal operation to avoid the turn-on of the parasitic SCRs, while the third heavy ion-doped region 205*a* is floating during an ESD current. Therefore, the second snapback device 208 forms a power clamp between the high voltage Vdd and a ground voltage. Because the power clamp is always needed for an ESD protection circuit, the area of the ESD protection circuit 500 can be reduced.

The ESD protection circuit disclosed by the above-mentioned embodiments of the invention has the following advantages:

1. The ring structure which is formed by an N-ring and its control circuit can improve the latch-up immunity of the ESD protection circuit during the normal operation.

2. The second snapback device formed by the second heavy ion-doped region of the first snapback device and the third heavy ion-doped region of the ring structure can serve as a power clamp as the control circuit provides an operational voltage in the normal operation. Therefore, area of the ESD protection circuit can be reduced.

3. There are two parasitic SCRs formed in the substrate, which can provide two paths for discharging the ESD current. Therefore, the ESD robustness of the ESD protection circuit can be improved.

While the invention has been described by way of example and in terms of two preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An ESD protection circuit, connected to an input pad, comprising:

a substrate of a first conductivity type;

a diode device, formed in the substrate and having a first end of the first conductivity type and a second end of a second conductivity type, wherein the first end is connected to the input pad;

a first snapback device, formed in the substrate and comprising a first doped region of the second conductivity type, a first gate and a second doped region of the second conductivity type, wherein the first doped region is coupled to the second end, the first gate is coupled to the second doped region;

a ring structure, formed in the substrate and comprising a third doped region of the second conductivity type located between the diode device and the second doped region;

a second snapback device, formed in the substrate and comprising the second doped region, a second gate and the third doped region, wherein the second gate is coupled to the second doped region; and a control circuit, connected to the third doped region for providing an operational voltage to the second snapback device in a normal operation.

2. The ESD protection circuit according to claim 1, wherein the first snapback device is a first metal oxide semiconductor (MOS) transistor, and the second snapback device is a second MOS transistor.

3. The ESD protection circuit according to claim 2 wherein the first conductivity type is a P type and the second conductivity type is an N type.

4. The ESD protection circuit according to claim 1, wherein the diode device is formed in a first well of the second conductivity type, and the third doped region is formed upon a second well of the second conductivity type.

5. The ESD protection circuit according to claim 4, wherein the second well comprises a first part and a second part, the first part of the second well is deeper than the third doped region and the second part of the second well is located within the third doped region.

6. The ESD protection circuit according to claim 4, wherein the first end of the diode device, the first well, the substrate and the second doped region form a silicon-controlled rectifier (SCR).

7. The ESD protection circuit according to claim 4, wherein the first end of the diode device, the first well, the substrate and the third doped region form a silicon-controlled rectifier (SCR).

8. The ESD protection circuit according to claim 1, wherein the first snapback device and the second snapback device are formed in a first well of the first conductivity and the diode device, the first snapback device, the second snapback device and the first well are formed in a second well of the second conductivity type.

9. The ESD protection circuit according to claim 8, wherein the first end of the diode device, the second well, the first well and the third doped region form a silicon-controlled rectifier.

10. The ESD protection circuit according to claim 8, wherein the first end of the diode device, the second well, the first well and the second doped region form a silicon-controlled rectifier.

11. The ESD protection circuit according to claim 8, wherein the first well is a P-well and the second well is a deep N-well.

12. The ESD protection circuit according to claim 1, wherein the control circuit provides a high voltage to the third doped region in the normal operation and the third doped region is floating during an ESD current.

13. The ESD protection circuit according to claim 1, wherein the control circuit comprises a switch coupled to the input pad, the switch is turned on to conduct a pad signal from the input pad to the ring structure in the normal operation, and the switch is turned off during an ESD event.

14. The ESD protection circuit according to claim 13, wherein the switch is complemented by a MOS transistor.

15. The ESD protection circuit according to claim 1, wherein the diode device is a diode string.

16. The ESD protection circuit according to claim 1, wherein the input pad is a high-voltage input pad.

17. An ESD protection circuit, connected to an input pad, comprising:

a substrate of a first conductivity type, the substrate comprising a first well of a second conductivity type and a second well of the second conductivity type;

a diode device, formed in the substrate and having a first end of the first conductivity type and a second end of second conductivity type, wherein the first end is connected to the input pad;

a first snapback device, formed in the substrate and comprising a first doped region of the second conductivity type, a first gate and a second doped region of the second conductivity type, wherein the first doped region is coupled to the second end, and the first gate is coupled to the second doped region;

a ring structure, formed in the substrate, the ring structure comprising a third doped region of the second conductivity type located between the diode device and the second doped region; and a control circuit, connected to the third doped region for providing an operational voltage to the ring structure in a normal operation;

wherein the second doped region is located between the first doped region and the third doped region, the second well is located between the first well and the second doped region, the diode device is formed in the first well of the second conductivity type, and the third doped region is formed upon the second well of the second conductivity type.

18. The ESD protection circuit according to claim 17, wherein the first snapback device is a first MOS transistor.

19. The ESD protection circuit according to claim 18, wherein the first conductivity type is a P type and the second conductivity type is an N type.

20. The ESD protection circuit according to claim 17, wherein the second well comprises a first part and a second part, the first part of the second well is deeper than the third doped region and the second part of the second well is located within the third doped region.

21. The ESD protection circuit according to claim 17, wherein the substrate comprises a deep N-well, the ring structure comprises a P-well formed in the deep N-well, the diode device is formed in a region of the deep N-well outside the P-well, the first snapback device is formed in the P-well.

22. The ESD protection circuit according to claim 17, wherein the control circuit provides a high voltage to the third doped region in the normal operation and the third doped region is floating during an ESD current.

23. The ESD protection circuit according to claim 17, wherein the diode device is a diode string.

24. The ESD protection circuit according to claim 17, wherein the input pad is a high-voltage input pad.

25. The ESD protection circuit according to claim 17, wherein the first end of the diode device, the first well, the substrate and the second doped region form a silicon-controlled rectifier (SCR).

26. The ESD protection circuit according to claim 17, wherein the first end of the diode device, the first well, the substrate and the third doped region form a silicon-controlled rectifier (SCR).

27. The ESD protection circuit according to claim 17, further comprising a second gate formed on the substrate, wherein the second doped region, the second gate and the third doped region form a second snapback device.

* * * * *